United States Patent
DiGiacomo et al.

[11] Patent Number: 6,085,831
[45] Date of Patent: Jul. 11, 2000

[54] DIRECT CHIP-COOLING THROUGH LIQUID VAPORIZATION HEAT EXCHANGE

[75] Inventors: Giulio DiGiacomo, Hopewell Junction; Sushumna Iruvanti, Wappingers Falls, both of N.Y.; David J. Womac, Avon, Conn.

[73] Assignee: International Business Machines Corporation, Armonk, N.Y.

[21] Appl. No.: 09/261,345

[22] Filed: Mar. 3, 1999

[51] Int. Cl.[7] .................................................. F28D 15/00
[52] U.S. Cl. ..................................... 165/104.33; 165/80.4; 165/104.26; 165/185; 361/700; 174/15.2
[58] Field of Search .......................... 165/80.3, 80.4, 165/104.21, 104.26, 104.33, 185; 257/715; 174/15.2; 361/699, 700, 385

[56] References Cited

U.S. PATENT DOCUMENTS

| | | |
|---|---|---|
| 3,971,435 | 7/1976 | Peck . |
| 4,047,198 | 9/1977 | Sekhon ............................. 165/104.33 |
| 4,104,700 | 8/1978 | Hutchison et al. . |
| 4,519,447 | 5/1985 | Wiech, Jr. . |
| 4,833,567 | 5/1989 | Saaki et al. ....................... 165/104.26 |
| 4,951,740 | 8/1990 | Peterson et al. ................... 165/104.26 |
| 5,000,256 | 3/1991 | Tousignant ........................ 165/104.33 |
| 5,024,264 | 6/1991 | Natori et al. . |
| 5,199,165 | 4/1993 | Crawford et al. . |
| 5,219,020 | 6/1993 | Akachi . |
| 5,308,920 | 5/1994 | Itoh ....................................... 174/16.3 |
| 5,323,292 | 6/1994 | Brzezinski .......................... 165/80.4 |
| 5,325,913 | 7/1994 | Altoz . |
| 5,411,077 | 5/1995 | Tousignant ........................ 165/104.33 |
| 5,582,242 | 12/1996 | Hamburgen et al. ............. 165/104.21 |
| 5,937,936 | 8/1999 | Furukawa et al. ................ 165/104.33 |
| 5,998,863 | 12/1999 | Kobayashi et al. ................ 165/104.33 |
| 6,005,772 | 12/1999 | Terao et al. ............................. 361/699 |
| 6,019,167 | 2/2000 | Bishop et al. ..................... 165/104.33 |

*Primary Examiner*—Ira S. Lazarus
*Assistant Examiner*—Terrell McKinnon
*Attorney, Agent, or Firm*—DeLio & Peterson, LLC; Shirley S. Ma; Aziz M. Ahsan

[57] ABSTRACT

An apparatus for and method of cooling an electronic module comprising a heat sink enclosure placed directly over a chip or substrate in a flip chip package. The heat sink enclosure has a plurality of cooling fins extending from within the cavity of the enclosure. A liquid sealed inside the enclosure is trapped within a thermal transfer means, preferably a metal wick, which sits directly on a chip or substrate. As the chip or substrate heats up, heat is transferred to the thermal transfer means which in turn heats the liquid to its heat of vaporization. The vapors of the liquid rise and condense on the cooling fins and the heat is absorbed by the enclosure and conducted to an outside surface of the enclosure and dissipated. Cooling fins on an exterior surface of the enclosure further reduces the thermal resistance to enhance cooling.

51 Claims, 2 Drawing Sheets

DIRECT CHIP-COOLING THROUGH LIQUID VAPORIZATION HEAT EXCHANGE

BACKGROUND OF THE INVENTION

1. Field of the Invention

The present invention relates to the design and manufacture of semiconductor devices, in particular, a method of and apparatus for cooling a semiconductor chip in an electronic package.

2. Description of Related Art

Thermal management is a key issue in the design of the electronic package. The proper design insures that the peak temperatures remain within a specified operating range to produce a reliable module. The main objective is to maintain the semiconductor device junction temperature below the maximum operating temperature of the module. Design challenges included in heat removal are higher circuit densities, close proximity of adjacent devices or components, low thermal conductivity substrates, inner layers of metal forming the interconnect, and the thermal resistance of heat sink systems.

The purpose of any heat transfer design is to allow the flow of thermal energy from heat source to heat sink within the constraints of specified temperature levels. In the case of high performance machines, the burden of cooling has been shifting from the system level to the component level. Multi-chip modules having an increasingly close placement of components having high heat fluxes means that the various thermal resistances, from the internal heat sources to the external final heat sink, must be reduced. The prior art is replete with cooling mechanisms utilizing different mediums of heat exchange including liquids or solids, as discussed below.

U.S. Pat. No. 5,325,913 issued to Altoz discloses an apparatus used for cooling electronic components. The apparatus comprises of a heat sink enclosure having a wick bonded to the inside surface of the cavity of the enclosure. The enclosure has a plug containing a meltable pellet such that a working fluid is sealed inside a cavity of the enclosure permeates the wick. When the pellet melts, a vapor of the working fluid travels through the passage in the plug, thereby cooling the enclosure by releasing the vapor. However, the apparatus of this reference is considerably limited by the internal resistance between the component and the heat-sinking closure since the heat must flow from a chip through the substrate, heat sink, and wick in order to vaporize the working fluid within the heat sink enclosure.

U.S. Pat. No. 5,219,020 to Akachi discloses the structure of a heat pipe-type cooling mechanism for attachment to the surface of a heat sink. The heat dissipation contribution of the heat pipe-type mechanism reduces only the external resistance. The reference neither suggests nor discloses cooling semiconductor chips directly.

U.S. Pat. No. 5,024,264 to Natori et al. discloses a method of cooling a semiconductor devise with a cooling unit using a metal sherbet, a metal in liquid and solid phases, as a heat conducting body placed between a cooling unit and a heat generating devise. This reference uses conduction as a heat transfer means through a semi-liquid alloy which has limited cooling capacity for a semiconductor chip.

U.S. Pat. No. 5,199,165 to Crawford et al. discloses a heat pipe apparatus using a fluid phase change chamber in thermal contact with two or more electronic components. However, there is a great deal of thermal resistance across package layers, interconnects, and interfaces from the chip or component to the substrate, which limits the rate at which the heat can be dissipated despite the efficiency of the heat pipe mechanism.

U.S. Pat. No. 4,519,447 to Wiech, Jr. discloses a substrate cooling system using heat pipes and a bi-phase liquid metal such as mercury for the working fluid. Heat from the electrical component is transmitted from the substrate or chip to the heat sink. The working fluid in the vapor phase is transported along the continuous closed path of the cooling system. The cooling process is effected by the heat pipes or conduits which run on or within the substrate. However, the pipes must be in contact with the substrate or chip to extract the heat through liquid vaporization. Due to the internal resistance through many interfaces and the long piping system, the cooling process is not as efficient.

U.S. Pat. No. 4,104,700 to Hutchison et al. discloses a cooling system utilizing heat pipes attached to the frame or supporting carrier for the integrated circuits. Again as in other prior art cooling mechanisms using heat pipes, the limitation of multiple resistances along the heat path limit the heat removal efficiency.

U.S. Pat. No. 3,971,435 to Peck discloses yet another heat pipe cooling system. The cooling mechanism disclosed is applicable to substrates and cards which contain or require contact interfaces. The battery of thermal resistances severely limit the heat dissipation rate. This reference neither suggests nor discloses a method of directly cooling the chip within the electronic package.

Bearing in mind the problems and deficiencies of the prior art, it is therefore a object of the present invention to provide a method and apparatus for directly cooling a semiconductor chip in an electronic package.

It is another object of the present invention to provide a method and apparatus with low heat resistance between a heat source and a cooling unit in an electronic package.

It is yet another object of the present invention to provide a cooling system that would improve the heat dissipation of high power modules.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a cooling device for an electronic component comprising an enclosure having an interior cavity; a plurality of fins extending within the cavity of the enclosure; a thermal transfer means for attachment to an electronic component; a liquid sealed inside the cavity of the enclosure permeating the thermal transfer means; and a seal for attaching and sealing the enclosure to an electronic package forming a liquid tight seal.

The enclosure is disposed on a periphery of the component and is adapted to draw heat away from the component through the thermal transfer means as the liquid vaporizes from the thermal transfer means. In situations where the electronic package contains an underfill between a chip and a substrate and wherein the enclosure is disposed on a periphery of the substrate providing a seal, heat is drawn away from the component through the thermal transfer means as the liquid vaporizes. The liquid is adapted to be vaporized and condensed on the fins to re-saturate the thermal transfer means, releasing heat to be absorbed by the enclosure, conducted to an outside surface of the enclosure and dissipated.

The enclosure may comprise a thermally conductive heat sink material. Preferably, the enclosure comprises a thermally conductive material selected from the group consisting of aluminum, copper, aluminum nitride, and silicon carbide. Most preferably, the enclosure comprises aluminum. The enclosure may further comprise a plurality of cooling fins on an exterior surface of the enclosure.

The thermal transfer means comprises a preform of compacted wire mesh or a porous, thermally conductive material.

The liquid inside the enclosure comprises a liquid having a boiling point of about room temperature to about 150°C., preferably comprising an organic liquid, a mixture of at least two organic liquids, water, or an aqueous solution such as ammonium hydroxide.

The seal of the first aspect of the present invention comprises a sealable O-ring disposed on a periphery of the component corresponding to a periphery of the enclosure. The seal may comprise of a polymer O-ring, an elastomer O-ring.

Preferably, the heat sink enclosure has a plugged opening such that the liquid can be poured into the enclosure subsequent to attaching the enclosure to an electronic package.

The present invention is directed to, in another aspect, an electronic module comprising a substrate; at least one semiconductor chip mounted on the substrate, the chip having a metal wick disposed on a surface of the chip opposite the substrate; a liquid filled cooling device mounted over the at least one chip, the cooling device comprising a heat sink enclosure having a plurality of cooling fins extending within the heat sink enclosure; and a liquid tight seal between the cooling device and the chip, wherein the chip is adapted to be cooled by the vaporization and condensation of the liquid within the cooling device as heat from the chip travels through the metal wick vaporizing the liquid which rises to condense on the cooling fins, the heat being absorbed by the heat sink enclosure and conducted to an outside surface of the heat sink enclosure.

The heat sink enclosure may further comprise a plurality of cooling fins on an exterior surface of the enclosure. The heat sink enclosure, preferably, comprises a thermally conductive material selected from the group consisting of aluminum, copper, aluminum nitride, and silicon carbide. Most preferably, the enclosure comprises aluminum.

The metal wick within the heat sink enclosure comprises a preform of compacted wire mesh.

The liquid inside the heat sink enclosure comprises a liquid having a boiling point of about room temperature to about 150°C., preferably comprising an organic liquid, a mixture of at least two organic liquids, water, or an aqueous solution such as ammonium hydroxide.

The seal may comprise a polymeric O-ring having thermosetting properties, a polymeric O-ring containing a thermoplastic adhesive, an elastomeric O-ring having thermosetting properties, or an elastomeric O-ring containing a thermoplastic adhesive.

The present invention is directed to, in yet another aspect, an improved electronic module having a chip and substrate mechanically and electrically interconnected wherein the improvement comprises a metal wick disposed on the chip; and a heat sink enclosure sealably attached to the chip and the wick having a plurality of cooling fins therein sufficiently filled with a working liquid to constantly wet the wick, such that heat generated by the chip is adapted to be transferred to the metal wick, vaporizing the liquid to condense on the cooling fins while the heat sink enclosure absorbs the heat carried by the vapors of the liquid and conducts the heat to an outside surface of the heat sink enclosure. The heat sink enclosure of the improved electronic module may further comprise a plurality of cooling fins on an exterior surface of the heat sink enclosure.

The present invention is directed to, in still yet another aspect, a method of cooling a chip in an electronic module comprising the steps of: providing an electronic module comprising a substrate and a chip mechanically and electrically interconnected; providing a metal wick; providing a cooling device comprising a heat sink enclosure having a plurality of cooling fins extending within the enclosure and a portal; placing the metal wick on the chip; attaching the cooling device to the module; and sufficiently filling the enclosure with a working liquid such that the wick is wetted and soaked by the liquid, wherein activation of the electronic module produces heat, the heat is transferred to the metal wick vaporizing the liquid forming vapors which rise and condense on the cooling fins, and wherein the heat is absorbed by the heat sink enclosure to cool the chip and conducted to an outside surface of the heat sink enclosure.

The step of attaching the cooling device to the module may comprise providing a thermosetting O-ring; placing the O-ring on a periphery of the chip; applying the heat sink enclosure to the chip such that contact is made with the O-ring to produce a seal around a perimeter of the O-ring; and curing the O-ring at an appropriate temperature and a length of time such that a liquid tight seal is produced in the heat sink enclosure. The thermosetting O-ring may further comprise a thermoplastic adhesive.

The step of attaching the cooling device to the module may comprise providing a thermosetting O-ring; placing the O-ring on a periphery of the substrate; applying the heat sink enclosure to the substrate such that contact is made with the O-ring to produce a seal around a perimeter of the O-ring; and curing the O-ring at an appropriate temperature and a length of time such that a liquid tight seal is produced in the heat sink enclosure. The thermosetting O-ring may further comprise a thermoplastic adhesive.

The metal wick within the heat sink enclosure comprises a preform of compacted wire mesh.

The heat sink enclosure may further comprise a plurality of cooling fins on an exterior surface of the enclosure. The heat sink enclosure, preferably, comprises a thermally conductive material selected from the group consisting of aluminum, copper, aluminum nitride, and silicon carbide.

The liquid inside the heat sink enclosure comprises a liquid having a boiling point of about room temperature to about 150°C., preferably comprising an organic liquid, a mixture of at least two organic liquids, water, or an aqueous solution such as ammonium hydroxide.

BRIEF DESCRIPTION OF THE DRAWINGS

The features of the invention believed to be novel and the elements characteristic of the invention are set forth with particularity in the appended claims. FIGS. 1–2 are for illustration purposes only and are not drawn to scale. The invention itself, however, both as to organization and method of operation, may best be understood by reference to the detailed description which follows taken in conjunction with the accompanying drawings in which:

FIG. 1 is an elevational cross-sectional view of a preferred embodiment of the present invention wherein the electronic package is in an upright position.

FIG. 2 is an elevational cross-sectional view of a preferred embodiment of the present invention wherein the electronic package being cooled is in the vertical position.

DESCRIPTION OF THE PREFERRED EMBODIMENTS(S)

Figure 1:
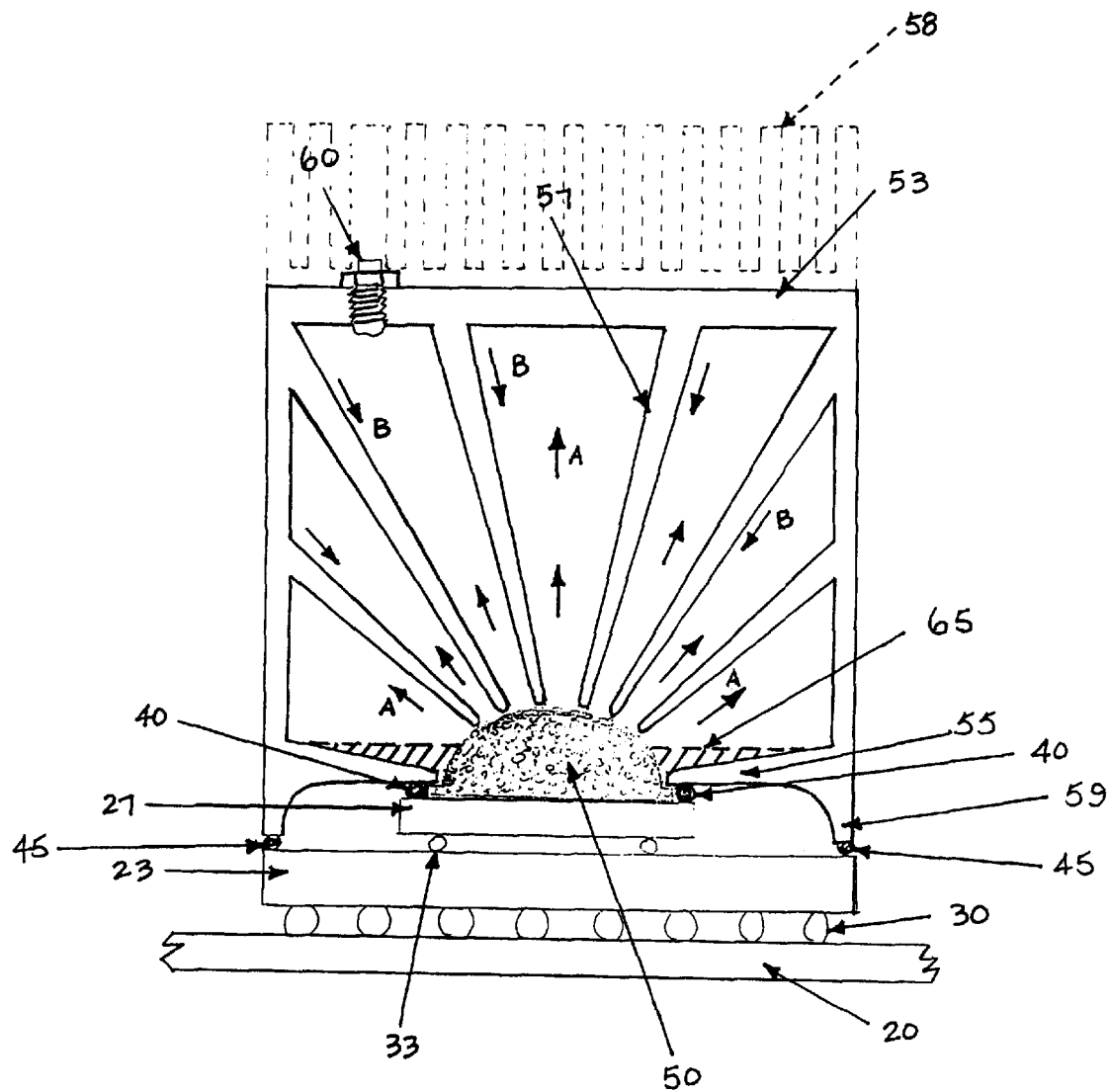

In describing the preferred embodiment of the present invention, reference will be made herein to FIGS. 1–2 of the drawings in which like numerals refer to like features of the invention. Features of the invention are not necessarily shown to scale in the drawings.

Figure 2:
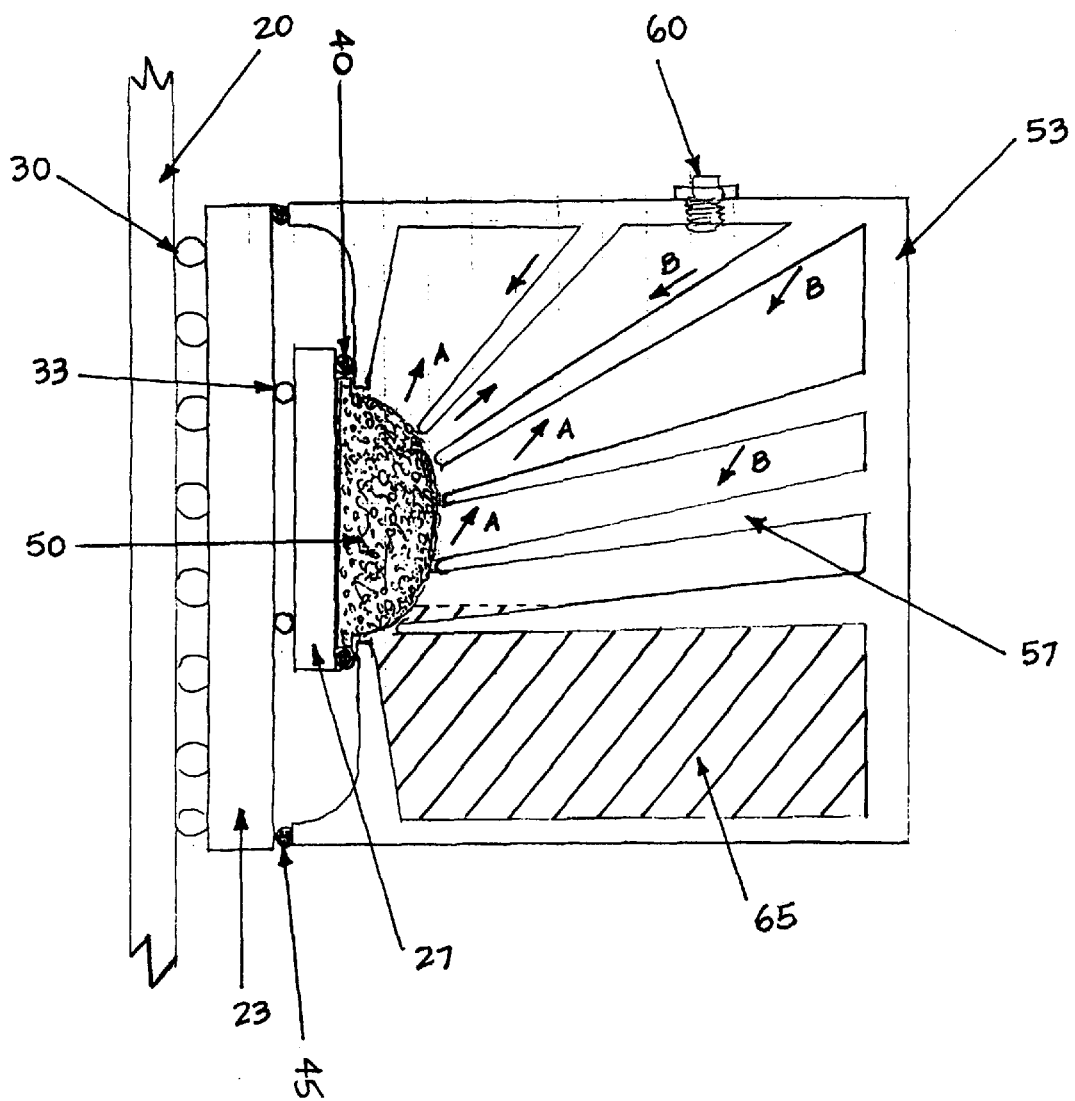

In FIGS. 1 and 2, there is shown an electronic package being cooled with a preferred embodiment of the present invention. The electronic package comprises of a card or circuit board 20 wherein substrate 23 is mounted to the card 20 and is physically and electrically connected utilizing, for example, a ball grid array 30. The ball grid array 30 comprises a number of solder balls which electrically and physically connect the substrate to the printed circuit board. Mounted on substrate 23 is semiconductor chip 27. Chip 27 is electrically and physically connected to substrate 23 by solder interconnections 33. During operation of the electronic device or module, heat dissipation rates of about 20 to 100 Watts are needed depending upon the external thermal resistance and the design of the electronic module.

In order to cool the electronic module a thermal transfer means is attached to chip 27, preferably, in direct contact with the chip surface. Preferably, the thermal transfer means is the metal wick 50 comprising a preform of compacted wire mesh. The wick 50 as shown is a wire screen mesh made of a porous metal that will absorb liquid. Such wicks are well-known in the art. Alternatively, the thermal transfer means may be a highly, thermally conductive porous material, such as a ceramic material, having numerous cavities allowing an increased surface area to promote vaporization of the working liquid used in the present invention.

To attach the heat sink enclosure 53 to an electronic package, a polymeric or elastomeric O-ring 40 can be placed on the periphery of chip 27 such that the horizontally extending flange 55 of the heat sink enclosure 53 rests on the O-ring 40. To further secure the heat sink enclosure 53 on the package, a second O-ring 45 is placed on the periphery of substrate 23 with the vertically extending flange 59 of the enclosure resting on the second O-ring 45. Alternatively, the first O-ring 40 may be placed on the periphery of the substrate 23 while the second O-ring 45 is placed on board 20 such that the horizontally extending flange 55 is disposed on substrate 23 and the vertically extending flange is disposed on board 20. However, this alternative requires an underfill 25 between chip 27 and substrate 23 to prevent shorts.

Preferably, the O-ring 40 is a polymer or elastomer having thermosetting properties or containing an adhesive. Heat sink enclosure 53 is then placed over the chip 27 enclosing chip 27 and metal wick 50 therein. The heat sink enclosure 53 is then sealed to the chip 27 and possibly substrate 23 by thermally setting the polymer or elastomer O-ring 40 forming a liquid tight seal.

The heat sink enclosure 53 has a plurality of generally planar cooling fins 57 extending into the cavity of heat sink enclosure 53. As shown in the elevational cross-sections, the cooling fins 57 extend from the enclosure walls radially downwards toward the metal wick 50. The cooling fins 57 will slope equally from the other two sides of heat sink enclosure 53 such that the free ends thereof are in close proximity to metal wick 50. Heat sink enclosure 53 comprises of a thermally conductive material such as copper, aluminum nitride, and silicon carbide, most preferably aluminum. The heat sink enclosure is most easily manufactured as a casted or molded integral single piece. The size and shape of the heat sink enclosure 53 will depend on such factors as the size and shape of the electronic components.

A working liquid 65 is dispensed into the heat sink enclosure 53 through the pluggable opening 60. Preferably, the liquid 65 should have a boiling point of about room temperature to about 150° C. such that the liquid vaporizes at some temperature below the upper limit of the operating temperature of the electronic module. The liquid 65 may comprise water, an aqueous solution such as ammonium hydroxide, an organic liquid such as an alcohol, or a mixture of at least two organic liquids. Water is an especially good working liquid to use since it has a relatively high heat of vaporization. The type of liquid used should be compatible with the materials of the heat sink enclosure 53 to prevent any corrosion. However, selecting the working liquid is no burden and compatibility is easily achieved by a person skilled in the art.

The liquid 65 normally collects by gravity at the lower end of the enclosure 53 and is taken up into metal wick 50 by capillary action such that metal wick 50 is completely saturated with the liquid 65. As chip 27 heats up during operation, the heat flows directly from the chip to the metal wick 50. When the working liquid 65 in the wick reaches its vaporization temperature, it evaporates. The resulting vapors of liquid 65 are trapped inside heat sink enclosure 53 rising towards the cooling fins 57 and the interior surfaces of heat sink enclosure 53 in the direction of arrow A. The condensed liquid 65 returns by gravity in the direction of arrow B along the surface of cooling fins 57 to re-saturate metal wick 50. The vapors of liquid 65 rise to the surface of heat sink enclosure 53 due to convection, driven by the lower vapor density gradient relative to air. The heat absorbed by the heat sink enclosure 53 is conducted to an outside surface of the enclosure where it dissipates.

In situations where the exterior resistance is quite high, the outside surface of the heat sink enclosure 53 may also have cooling fins or the surface may be corrugated to further enhance heat dissipation by reducing the exterior resistance. The dotted lines in FIG. 1 show an example of external fins 58 on an outer surface of enclosure 53. However, the drawing should not limit the placement of the external fins on any outer surface of enclosure 53.

In FIG. 2 is shown another embodiment of the present invention wherein the electronic module is in a vertical position. The reference numerals in FIG. 2 correspond to the same features as those shown in FIG. 1. The cooling fins 57 are curved in the direction perpendicular to the cross-sectional view such that the condensed liquid 65 is returned totally to the metal wick 50 to re-saturate the metal wick 50 from all directions.

The present invention achieves the objects recited above. The present invention provides a method of and apparatus for directly cooling a chip in an electronic package. The heat sink and thermal transfer means located directly on the chip provides a more efficient way of cooling the chip. The thermal resistance of the interface between chip and cooling mechanism are kept to a minimum. Where the external resistance is a limiting factor, the present invention allows for a design of the heat sink enclosure which allows further heat dissipation by corrugating the exterior of the enclosure.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A cooling device for an electronic component comprising an enclosure having an interior cavity;

a plurality of fins extending within the cavity of said enclosure;

a thermal transfer means for direct attachment to an electronic component;

a liquid inside the cavity of said enclosure permeating said thermal transfer means; and a seal for attaching and sealing said enclosure to an electronic component forming a liquid tight seal.

2. The device of claim 1 wherein said enclosure is disposed on a periphery of the component and is adapted to draw heat away from the component through said thermal transfer means as said liquid vaporizes from said thermal transfer means.

3. The device of claim 1 wherein the electronic component contains an underfill between a chip and a substrate and wherein said enclosure is disposed on a periphery of the substrate providing a seal, heat is drawn away from the component through said thermal transfer means as said liquid vaporizes.

4. The device of claim 1 wherein said liquid is adapted to be vaporized and condensed on said fins to permeate said thermal transfer means, and wherein heat is absorbed by the enclosure and conducted to an outside surface of said enclosure and dissipated.

5. The device of claim 1 wherein said enclosure comprises a thermally conductive heat sink material.

6. The device of claim 1 wherein said enclosure comprises a thermally conductive material selected from the group consisting of aluminum, copper, aluminum nitride, and silicon carbide.

7. The device of claim 1 wherein said enclosure comprises aluminum.

8. The device of claim 1 wherein said enclosure further comprises a plurality of cooling fins on an exterior surface of said enclosure.

9. The device of claim 1 wherein said thermal transfer means comprises a preform of compacted wire mesh.

10. The device of claim 1 wherein said thermal transfer means comprises a porous, thermally conductive material.

11. The device of claim 1 wherein said liquid comprises a liquid having a boiling point of about room temperature to about 150° C.

12. The device of claim 1 wherein said liquid comprises an organic liquid.

13. The device of claim 1 wherein said liquid comprises a mixture of at least two organic liquids.

14. The device of claim 1 wherein said liquid comprises water.

15. The device of claim 1 wherein said liquid comprises an aqueous solution having a boiling point of about room temperature to about 150° C.

16. The device of claim 1 wherein said liquid comprises ammonium hydroxide.

17. The device of claim 1 wherein said seal comprises a sealable O-ring disposed on a periphery of the component corresponding to a periphery of said enclosure.

18. The device of claim 1 wherein said seal comprises a polymer O-ring.

19. The device of claim 1 wherein said seal comprises an elastomer O-ring.

20. The device of claim 1 wherein said enclosure has a plugged opening such that said liquid can be poured into said enclosure subsequent to attaching said enclosure to an electronic package.

21. An electronic module comprising a substrate;

at least one semiconductor chip mounted on said substrate, said chip having a metal wick disposed on a surface of said chip opposite said substrate;

a liquid filled cooling device mounted over said at least one chip, said cooling device comprising a heat sink enclosure having a plurality of cooling fins extending within said heat sink enclosure; and a liquid tight seal between said cooling device and said chip, wherein said chip is adapted to be cooled by the vaporization and condensation of the liquid within said cooling device as heat from said chip travels through the metal wick vaporizing the liquid which rises to condense on the cooling fins, the heat being absorbed by said heat sink enclosure and conducted to an outside surface of said heat sink enclosure.

22. The module of claim 21 wherein said heat sink enclosure further comprises a plurality of cooling fins on an exterior surface of said enclosure.

23. The module of claim 21 wherein said heat sink enclosure comprises a thermally conductive material selected from the group consisting of aluminum, copper, aluminum nitride, and silicon carbide.

24. The module of claim 21 wherein said heat sink enclosure comprises aluminum.

25. The module of claim 21 wherein said metal wick comprises a preform of compacted wire mesh.

26. The module of claim 21 wherein the liquid within said cooling device comprises organic liquids.

27. The module of claim 21 wherein the liquid within said cooling device comprises water.

28. The module of claim 21 wherein the liquid within said cooling device comprises a liquid having a boiling point of about room temperature to about 150° C.

29. The module of claim 21 wherein the liquid within said cooling device comprises a mixture of at least two organic liquids.

30. The module of claim 21 wherein the liquid within said cooling device comprises ammonium hydroxide.

31. The module of claim 21 wherein the liquid within said cooling device comprises an aqueous solution having a boiling point of about room temperature to about 150° C.

32. The module of claim 21 wherein said seal comprises a polymeric O-ring having thermosetting properties.

33. The module of claim 21 wherein said seal comprises a polymeric O-ring containing a thermoplastic adhesive.

34. The module of claim 21 wherein said seal elastomeric O-ring having thermosetting properties.

35. The module of claim 21 wherein said seal comprises an elastomeric O-ring containing a thermoplastic adhesive.

36. An improved electronic module having a chip and substrate mechanically and electrically interconnected wherein the improvement comprises a metal wick disposed directly in said chip on said chip; and a heat sink enclosure sealably attached to said chip and said enclosure having a plurality of cooling fins therein sufficiently filled with a working liquid to constantly wet said wick, such that heat generated by said chip is adapted to be transferred to said metal wick, vaporizing said liquid to condense on said cooling fins while said heat sink enclosure absorbs the heat carried by the vapors of said liquid and conducts the heat to an outside surface of said heat sink enclosure.

37. The improved electronic module of claim 36 wherein said heat sink enclosure further comprises a plurality of cooling fins on an exterior surface of said heat sink enclosure.

38. A method of cooling a chip in an electronic module comprising the steps of:

providing an electronic module comprising a substrate and a chip mechanically and electrically interconnected;

providing a metal wick;

providing a cooling device comprising a heat sink enclosure having a plurality of cooling fins extending within said enclosure and a portal;

placing said metal wick directly on said chip on said chip;

sealably attaching said cooling device to said module; and sufficiently filling the enclosure with a working liquid such that said wick is wetted and soaked by said liquid, wherein activation of said electronic module produces heat, the heat is transferred to said metal wick vaporizing said liquid forming vapors which rise and condense on said cooling fins, and wherein the heat is absorbed by the heat sink enclosure to cool said chip and conducted to an outside surface of said heat sink enclosure.

39. The method of claim 38 wherein said step of attaching said cooling device to said module comprises providing a thermosetting O-ring;

placing said O-ring on a periphery of said chip;

applying the heat sink enclosure to said chip such that contact is made with said O-ring to produce a seal around a perimeter of said O-ring; and curing said O-ring at an appropriate temperature and a length of time such that a liquid tight seal is produced in the heat sink enclosure.

40. The method of claim 38 wherein said thermosetting O-ring further comprises a thermoplastic adhesive.

41. The method of claim 38 wherein said step of attaching said cooling device to said module comprises providing a thermosetting O-ring;

placing said O-ring on a periphery of said substrate;

applying the heat sink enclosure to said substrate such that contact is made with said O-ring to produce a seal around a perimeter of said O-ring; and curing said O-ring at an appropriate temperature and a length of time such that a liquid tight seal is produced in the heat sink enclosure.

42. The method of claim 40 wherein said thermosetting O-ring further comprises a thermoplastic adhesive.

43. The method of claim 38 wherein said metal wick comprises a preform of compacted wire mesh.

44. The method of claim 38 wherein said heat sink enclosure comprises a thermally conductive material selected from the group consisting of aluminum, copper, aluminum nitride, and silicon carbide.

45. The method of claim 38 wherein said heat sink enclosure further comprises a plurality of cooling fins on an exterior surface of said heat sink enclosure.

46. The method of claim 38 wherein said liquid comprises an organic liquid.

47. The method of claim 38 wherein said liquid comprises water.

48. The method of claim 38 wherein said liquid comprises ammonium hydroxide.

49. The method of claim 38 wherein said liquid comprises a liquid having a boiling point of about room temperature to about 150° C.

50. The method of claim 38 wherein said liquid comprises a mixture of at least two organic liquids.

51. The method of claim 38 wherein said liquid comprises an aqueous solution having a boiling point of about room temperature to about 150° C.

* * * * *

UNITED STATES PATENT AND TRADEMARK OFFICE
CERTIFICATE OF CORRECTION

PATENT NO. : 6,085,831
DATED : July 11, 2000
INVENTOR(S) : DiGiacomo et al.

It is certified that error appears in the above-identified patent and that said Letters Patent is hereby corrected as shown below:

In the Specification

Column 1, line 41, after "enclosure" insert - - and - - .

Column 1, line 57, delete "devise" and substitute therefor - - device - - .

Column 1, line 60, delete "devise" and substitute therefor - - device - - .

In the Claims

Column 8, line 57, claim 34, after "seal" insert - - comprises an - - .

Signed and Sealed this

Tenth Day of April, 2001

*Attest:*

NICHOLAS P. GODICI

*Attesting Officer*     *Acting Director of the United States Patent and Trademark Office*